United States Patent
Ha et al.

(10) Patent No.: US 8,942,041 B1
(45) Date of Patent: Jan. 27, 2015

(54) MEMORY DEVICE AND COLUMN DECODER FOR REDUCING CAPACITIVE COUPLING EFFECT ON ADJACENT MEMORY CELLS

(71) Applicant: Winbond Electronics Corp., Taichung (TW)

(72) Inventors: Im-Cheol Ha, Hsinchu (TW); Jen-Fu Su, Tainan (TW)

(73) Assignee: Windbond Electronics Corp., Taichung (TW)

( * ) Notice: Subject to any disclaimer, the term of this patent is extended or adjusted under 35 U.S.C. 154(b) by 0 days.

(21) Appl. No.: 14/068,719

(22) Filed: Oct. 31, 2013

(51) Int. Cl.
| | |
|---|---|
| *G11C 8/10* | (2006.01) |
| *G11C 8/00* | (2006.01) |
| *G11C 7/12* | (2006.01) |
| *G11C 5/06* | (2006.01) |
| *G11C 11/4094* | (2006.01) |
| *G11C 16/08* | (2006.01) |
| *G11C 16/34* | (2006.01) |
| *G11C 13/00* | (2006.01) |
| *G11C 16/24* | (2006.01) |
| *G11C 11/408* | (2006.01) |

(52) U.S. Cl.
CPC ........ *G11C 16/3427* (2013.01); *G11C 13/0026* (2013.01); *G11C 16/24* (2013.01); *G11C 13/0023* (2013.01); *G11C 11/4087* (2013.01); *G11C 7/12* (2013.01); *G11C 16/08* (2013.01); *G11C 8/10* (2013.01)
USPC ................... 365/185.16; 365/189.06; 365/63; 365/230.06

(58) Field of Classification Search
CPC .......... G11C 16/24; G11C 16/08; G11C 8/10; G11C 11/4087; G11C 7/12; G11C 13/0026; G11C 13/0023
USPC ..................... 365/63, 185.16, 189.06, 230.06
See application file for complete search history.

(56) References Cited

U.S. PATENT DOCUMENTS

| | | | | |
|---|---|---|---|---|
| 6,307,807 | B1 * | 10/2001 | Sakui et al. | ................. 365/238.5 |
| 2003/0142540 | A1 * | 7/2003 | Tanizaki et al. | ............... 365/171 |
| 2008/0117700 | A1 * | 5/2008 | Nakamura | .................... 365/205 |
| 2008/0158934 | A1 * | 7/2008 | Kang et al. | .................... 365/145 |

* cited by examiner

*Primary Examiner* — Ly D Pham
(74) *Attorney, Agent, or Firm* — Muncy, Geissler, Olds & Lowe, P.C.

(57) ABSTRACT

A memory device includes a memory cell array and a column decoder. The memory cell array includes a plurality of even local bit lines and a plurality of odd local bit lines. The column decoder includes a plurality of even pass transistors, a plurality of even clamp transistors, a plurality of odd pass transistors, and a plurality of odd clamp transistors. Each of the even clamp transistors has a control terminal coupled to an even clamp line, a first terminal coupled to a respective one of the even local bit lines, and a second terminal coupled to a ground voltage. Each of the odd clamp transistors has a control terminal coupled to an odd clamp line, a first terminal coupled to a respective one of the odd local bit lines, and a second terminal coupled to the ground voltage.

18 Claims, 7 Drawing Sheets

MEMORY DEVICE AND COLUMN DECODER FOR REDUCING CAPACITIVE COUPLING EFFECT ON ADJACENT MEMORY CELLS

BACKGROUND OF THE INVENTION

1. Field of the Invention

The disclosure generally relates to a memory device, and more particularly to a memory device comprising a column decoder for reducing the capacitive coupling effect on adjacent memory cells.

2. Description of the Related Art

Figure 1:
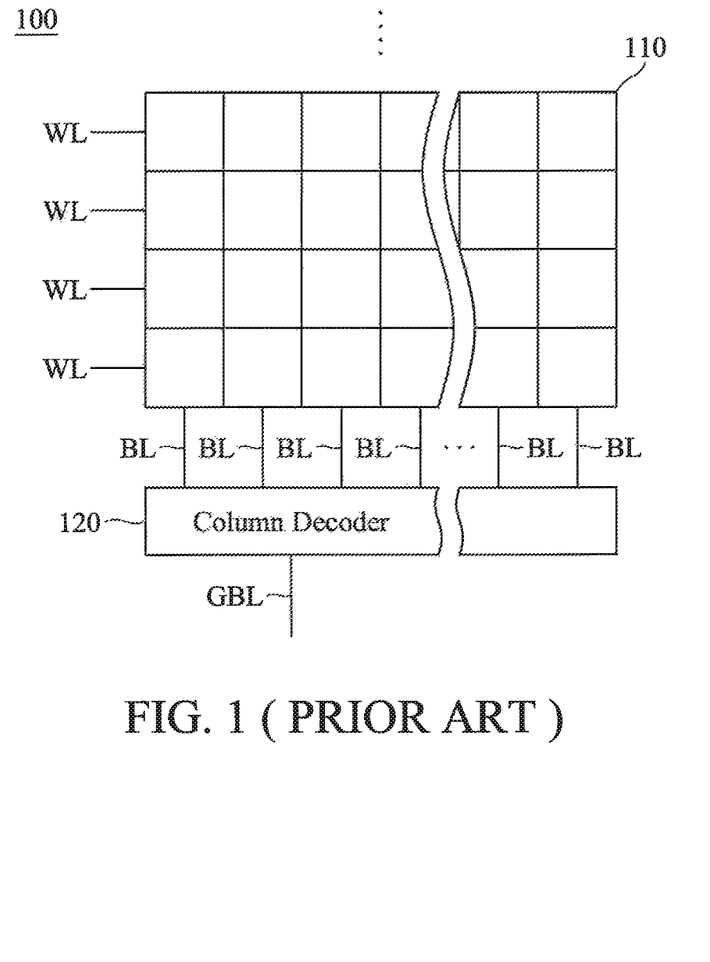
FIG. 1 is a diagram for illustrating a conventional memory device.

FIG. 1 is a diagram for illustrating a conventional memory device 100. As shown in FIG. 1, the memory device 100 at least comprises a memory cell array 110 and a column decoder 120. To simplify the diagram, other components of the memory device 100 are omitted and not shown in FIG. 1. The memory cell array 110 comprises a plurality of memory cells. A plurality of word lines WL and a plurality of local bit lines BL are configured to select the memory cells. Furthermore, the column decoder 120 is configured to selectively couple one of the local bit lines BL to a global bit line GBL.

Figure 2:
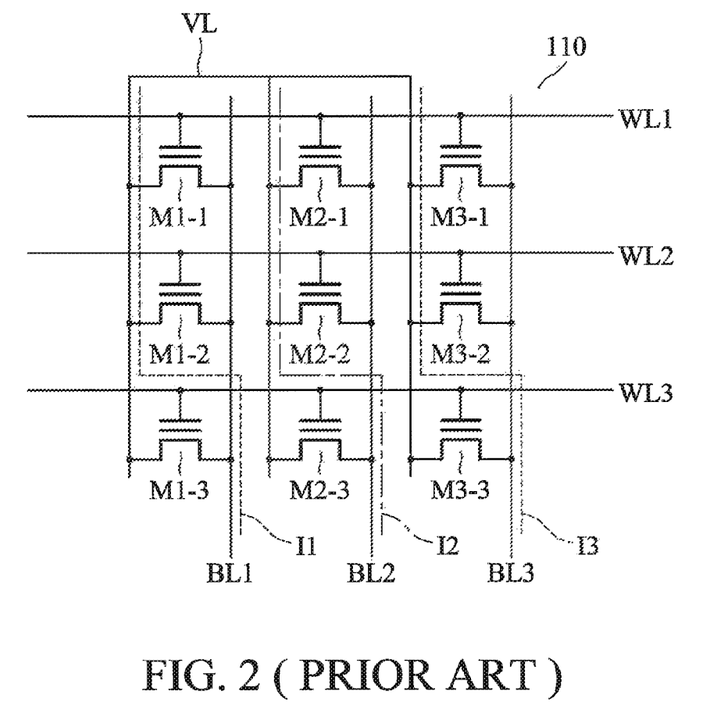
FIG. 2 is a diagram for illustrating a capacitive coupling effect on a conventional memory device.

FIG. 2 is a diagram for illustrating a capacitive coupling effect on a conventional memory device 100. As shown in FIG. 2, the memory cell array 110 is implemented with a plurality of memory transistors M1-1 to M3-3 (also known as "memory cells"). With the development of the semiconductor manufacturing process, the size of the memory device 100 is becoming much smaller, and thus the memory transistors M1-1 to M3-3 therein are getting closer to each other. This results in a serious mutual coupling effect due to parasitic capacitances between adjacent elements. For example, when a word line WL2 and a local bit line BL2 are selected, the memory transistors M1-2, M2-2, and M3-2 are enabled, and a current I2 flows through the selected local bit line BL2, the memory transistor M2-2, and a source line VL. Ideally, two adjacent local bit lines BL1 and BL3 should be kept float and no current is induced from them. Actually, however, unexpected coupling currents I1 and I3 are induced and flow through the memory transistors M1-2 and M3-2 and the unselected local bit lines BL1 and BL3 because of the capacitive coupling effect between the memory transistors M1-2, M2-2, and M3-2. This mutual coupling effect may lead to some operation errors and degrade the reliability of the memory device 100.

BRIEF SUMMARY OF THE INVENTION

In a preferred embodiment, the disclosure is directed to a memory device, comprising: a memory cell array, comprising a plurality of even local bit lines and a plurality of odd local bit lines; and a column decoder, comprising: a plurality of even pass transistors, wherein each of the even pass transistors has a control terminal coupled to a respective one of a plurality of even selection lines, a first terminal coupled to a respective one of the even local bit lines, and a second terminal coupled to a global bit line; a plurality of even clamp transistors, wherein each of the even clamp transistors has a control terminal coupled to an even clamp line, a first terminal coupled to a respective one of the even local bit lines, and a second terminal coupled to a ground voltage; a plurality of odd pass transistors, wherein each of the odd pass transistors has a control terminal coupled to a respective one of a plurality of odd selection lines, a first terminal coupled to a respective one of the odd local bit lines, and a second terminal coupled to the global bit line; and a plurality of odd clamp transistors, wherein each of the odd clamp transistors has a control terminal coupled to an odd clamp line, a first terminal coupled to a respective one of the odd local bit lines, and a second terminal coupled to the ground voltage.

In some embodiments, when one of the even pass transistors is selected and enabled, all of the even clamp transistors are disabled, and all of the odd clamp transistors are enabled to pull down all of the odd local bit lines to the ground voltage. In some embodiments, when one of the even pass transistors is selected and enabled, the other unselected even pass transistors and all of the odd pass transistors are disabled. In some embodiments, when one of the odd pass transistors is selected and enabled, all of the odd clamp transistors are disabled, and all of the even clamp transistors are enabled to pull down all of the even local bit lines to the ground voltage. In some embodiments, when one of the odd pass transistors is selected and enabled, the other unselected odd pass transistors and all of the even pass transistors are disabled. In some embodiments, the even local bit lines are respectively interleaved with the odd local bit lines. In some embodiments, the memory device is NOR flash memory. In some embodiments, the memory cell array is EEPROM (Electrically-Erasable Programmable Read-Only Memory). In some embodiments, the even clamp transistors and the odd clamp transistors are NMOS transistors (N-type Metal-Oxide-Semiconductor Field-Effect Transistor). In some embodiments, the even pass transistors and the odd pass transistors are NMOS transistors.

In another preferred embodiment, the disclosure is directed to a method for controlling a memory device, comprising the steps of: providing a memory cell array, wherein the memory cell array comprises a plurality of even local bit lines and a plurality of odd local bit lines; providing a column decoder, wherein the column decoder comprises a plurality of even pass transistors, a plurality of even clamp transistors, a plurality of odd pass transistors, and a plurality of odd clamp transistors, wherein the even pass transistors are configured to selectively couple the even local bit lines to a global bit line, the even clamp transistors are configured to selectively couple the even local bit lines to a ground voltage, the odd pass transistors are configured to selectively couple the odd local bit lines to the global bit line, and the odd clamp transistors are configured to selectively couple the odd local bit lines to the ground voltage; selecting and enabling one of the even pass transistors or one of the odd pass transistors; when one of the even pass transistors is selected and enabled, disabling all of the even clamp transistors, and enabling all of the odd clamp transistors to pull down all of the odd local bit lines to the ground voltage; and when one of the odd pass transistors is selected and enabled, disabling all of the odd clamp transistors, and enabling all of the even clamp transistors to pull down all of the even local bit lines to the ground voltage.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures thereof in the invention are described in detail as follows.

Figure 3:
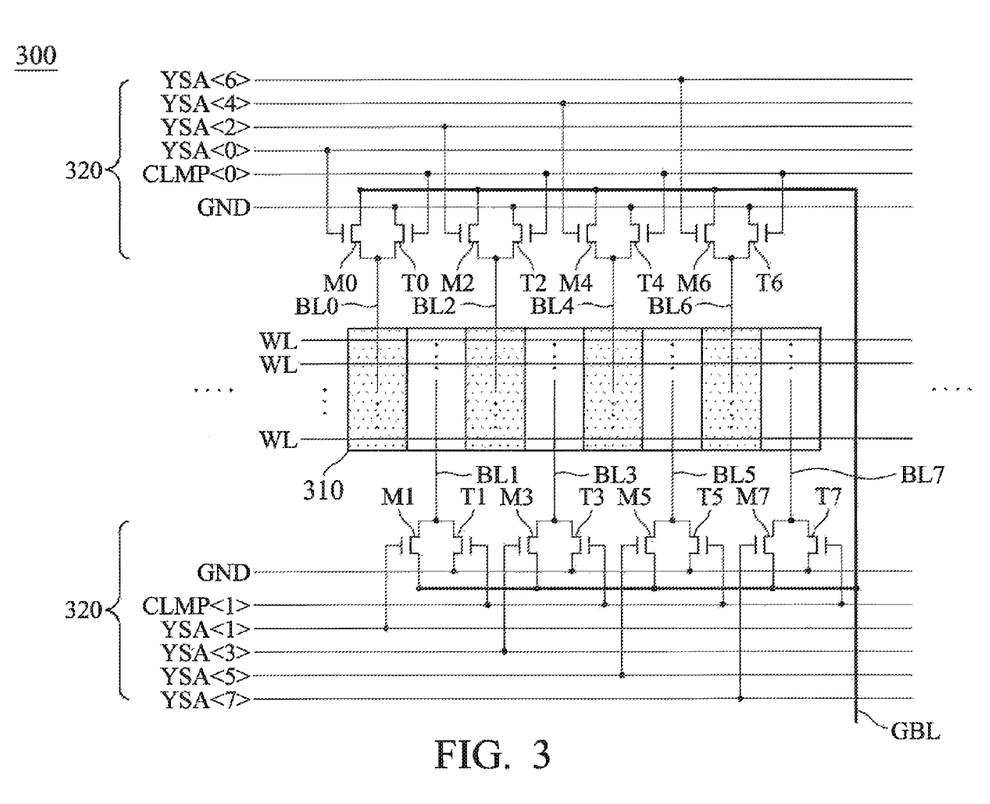
FIG. 3 is a diagram for illustrating a memory device according to an embodiment of the invention.

FIG. 3 is a diagram for illustrating a memory device 300 according to an embodiment of the invention. The memory device 300 may be flash memory, such as NOR flash memory. As shown in FIG. 3, the memory device 300 at least comprises a memory cell array 310 and a column decoder 320. It is understood that the memory device 300 may further comprise other components, such as a driver, a row decoder, and a SA (Sense Amplifier). To simplify the diagram, some components of the memory device 300 are omitted and not shown in FIG. 3. The memory cell array 310 comprises a plurality of memory cells. In some embodiments, the memory cell array 310 is EEPROM (Electrically-Erasable Programmable Read-Only Memory). The memory cell array 310 further comprises a plurality of word lines WL and a plurality of local bit lines BL0 to BL7 for selecting the memory cells. The local bit lines BL0 to BL7 may be categorized as a plurality of even local bit lines BL0, BL2, BL4, and BL6, and a plurality of odd local bit lines BL1, BL3, BL5, and BL7. Each even or odd local bit line is coupled to some memory cells arranged in a respective column. In some embodiments, the even local bit lines BL0, BL2, BL4, and BL6 are respectively interleaved with the odd local bit lines BL1, BL3, BL5, and BL7. The column decoder 320 is configured to selectively couple one of the even and odd local bit lines BL0 to BL7 to a global bit line GBL. The column decoder 320 may be controlled according to a control signal from a driver or a processor (not shown). More particularly, the column decoder 320 comprises an upper-half portion and a lower-half portion. The upper-half portion comprises a plurality of even pass transistors M0, M2, M4, and M6, and a plurality of even clamp transistors T0, T2, T4, and T6. The lower-half portion comprises a plurality of odd pass transistors M1, M3, M5, and M7, and a plurality of odd clamp transistors T1, T3, T5, and T7. It is understood that the memory device 300 may comprise more or less local bit lines, pass transistors, and clamp transistors although there are only eight element branches shown in FIG. 3. The number of the local bit lines, the pass transistors, and the clamp transistors is not limited in the invention. In other embodiments, the memory cell array 310 and the column decoder 320 may be copied and disposed in a periodic form, and only a portion of the periodic form is shown in FIG. 3

Each of the even pass transistors M0, M2, M4, and M6 has a control terminal coupled to a respective one of a plurality of even selection lines YSA<0>, YSA<2>, YSA<4>, and YSA<6>. For example, the even pass transistor M0 has a gate coupled to the even selection line YSA<0>. Each of the even pass transistors M0, M2, M4, and M6 has a first terminal coupled to a respective one of the even local bit lines BL0, BL2, BL4, and BL6. For example, the even pass transistor M0 has a source/drain coupled to the even local bit line BL0. Each of the even pass transistors M0, M2, M4, and M6 has a second terminal coupled to the global bit line GBL. For example, the even pass transistor M0 has another source/drain coupled to the global bit line GBL. Each of the odd pass transistors M1, M3, M5, and M7 has a control terminal coupled to a respective one of a plurality of odd selection lines YSA<1>, YSA<3>, YSA<5>, and YSA<7>. For example, the odd pass transistor M1 has a gate coupled to the odd selection line YSA<1>. Each of the odd pass transistors M1, M3, M5, and M7 has a first terminal coupled to a respective one of the odd local bit lines BL1, BL3, BL5, and BL7. For example, the odd pass transistor M1 has a source/drain coupled to the odd local bit line BL1. Each of the odd pass transistors M1, M3, M5, and M7 has a second terminal coupled to the global bit line GBL. For example, the odd pass transistor M1 has another source/drain coupled to the global bit line GBL. In some embodiments, the even pass transistors M0, M2, M4, and M6 and the odd pass transistors M1, M3, M5, and M7 are NMOS transistors (N-type Metal-Oxide-Semiconductor Field-Effect Transistor). The column decoder 320 selects one of the even and odd local bit lines BL0 to BL7 by controlling the even and odd selection lines YSA<0> to YSA<7>. For example, when the odd local bit line BL3 and the corresponding odd pass transistor M3 are selected, the odd selection line YSA<3> is pulled up to a high voltage (e.g., 1V or 4.5V), and the other odd selection lines YSA<1>, YSA<5>, and YSA<7> and all of the even selection lines YSA<0>, YSA<2>, YSA<4>, and YSA<6> are pulled down to a ground voltage (e.g., 0V). Accordingly, only the odd pass transistor M3 is enabled, and thus only the odd local bit line BL3 is coupled to the global bit line GBL. The selection of other local bit lines may be performed in a similar way to the above.

Each of the even clamp transistors T0, T2, T4, and T6 has a control terminal coupled to an even clamp line CLMP<0>. For example, the even clamp transistor T0 has a gate coupled to the even clamp line CLMP<0>. Each of the even clamp transistors T0, T2, T4, and T6 has a first terminal coupled to a respective one of the even local bit lines BL0, BL2, BL4, and BL6. For example, the even clamp transistor T0 has a source/drain coupled to the even local bit line BL0. Each of the even clamp transistors T0, T2, T4, and T6 has a second terminal coupled to a ground voltage GND. For example, the even clamp transistor T0 has another source/drain coupled to the ground voltage GND. Each of the odd clamp transistors T1, T3, T5, and T7 has a control terminal coupled to an odd clamp line CLMP<1>. For example, the odd clamp transistor T1 has a gate coupled to the odd clamp line CLMP<1>. Each of the odd clamp transistors T1, T3, T5, and T7 has a first terminal coupled to a respective one of the odd local bit lines BL1, BL3, BL5, and BL7. For example, the odd clamp transistor T1 has a source/drain coupled to the odd local bit line BL1. Each of the odd clamp transistors T1, T3, T5, and T7 has a second terminal coupled to the ground voltage GND. For example, the odd clamp transistor T1 has another source/drain coupled to the ground voltage GND. In some embodiments, the even clamp transistors T0, T2, T4, and T6 and the odd clamp transistors T1, T3, T5, and T7 are NMOS transistors (N-type Metal-Oxide-Semiconductor Field-Effect Transistor). In some embodiments, the even clamp line CLMP<0> and the odd clamp line CLMP<1> always have complementary logic levels, and are controlled according to the aforementioned control signal from the driver or the processor (not shown). The even clamp transistors T0, T2, T4, and T6 and the odd clamp transistors T1, T3, T5, and T7 are configured to reduce the mutual coupling effect between adjacent memory cells. Their detailed operations will be described in the following embodiments.

Figure 4:
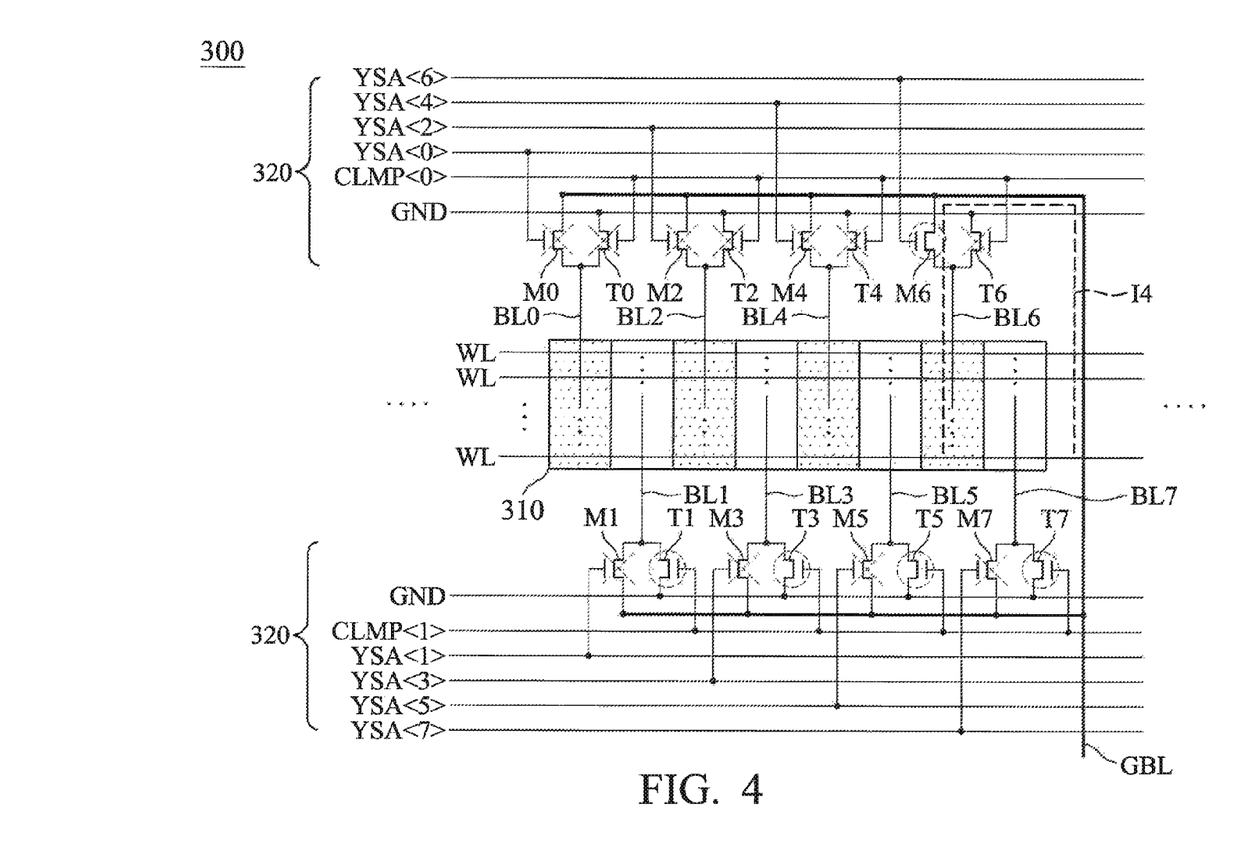
FIG. 4 is a diagram for illustrating an operation of a memory device when any one even local bit line is selected according to an embodiment of the invention.

FIG. 4 is a diagram for illustrating the operation of the memory device 300 when any one even local bit line is selected according to an embodiment of the invention. When any one of the even pass transistors M0, M2, M4, and M6 is selected and enabled, the corresponding even local bit line is selected and coupled to the global bit line GBL, and the other unselected even pass transistors and all of the odd pass transistors M1, M3, M5, and M7 are disabled. For example, when the even pass transistor M6 is selected and enabled, the corresponding even local bit line BL6 is selected and coupled to the global bit line GBL (a current I4 may flow through the even pass transistor M6), and the other unselected even pass transistors M0, M2, and M4 and all of the odd pass transistors M1, M3, M5, and M7 are disabled. In addition, when any one of the even pass transistors M0, M2, M4, and M6 is selected and enabled, all of the even clamp transistors T0, T2, T4, and T6 are disabled by the even clamp line CLMP<0>, and all of the odd clamp transistors T1, T3, T5, and T7 are enabled by odd clamp line CLMP<1> to pull down all of the odd local bit lines BL1, BL3, BL5, and BL7 to the ground voltage GND. For example, when the even pass transistor M6 is selected and enabled, all of the even clamp transistors T0, T2, T4, and T6 are disabled, and all of the odd clamp transistors T1, T3, T5, and T7 are enabled. To be brief, during some operations (e.g., read/program operations) of the memory device 300, one selected even local bit line is always adjacent to two unselected odd local bit lines coupled to the ground voltage GND.

Figure 5:
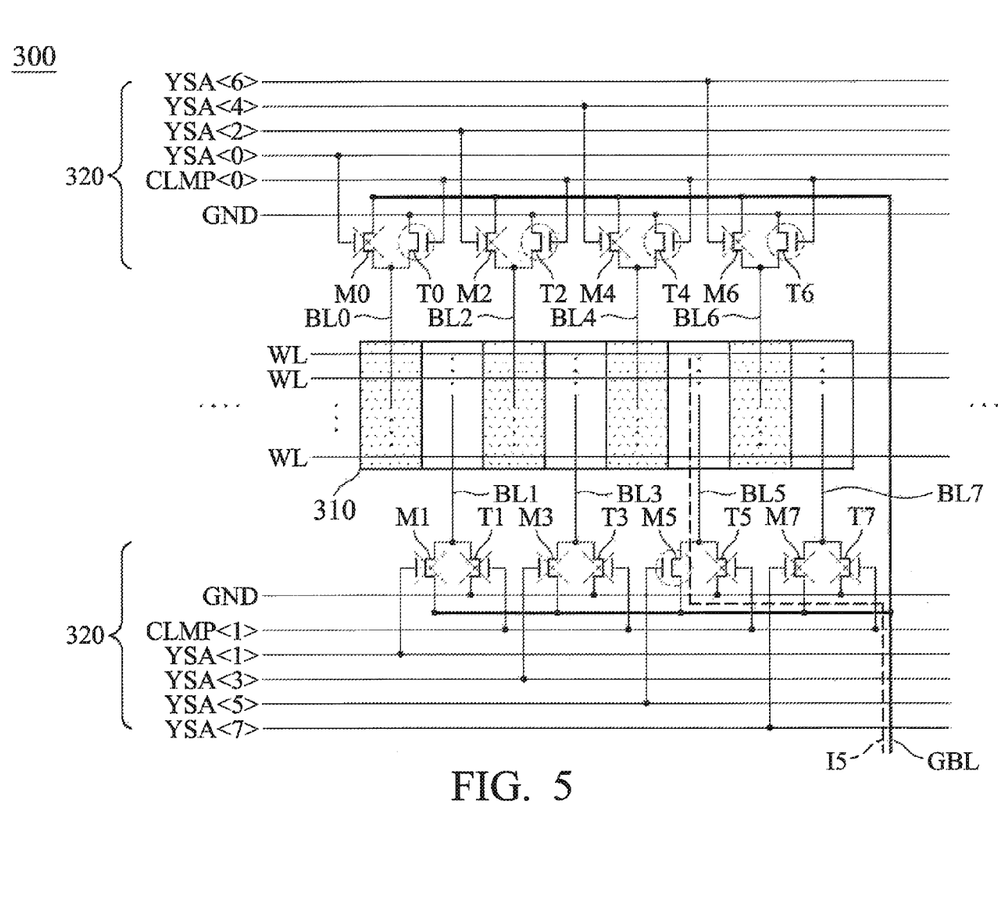
FIG. 5 is a diagram for illustrating an operation of a memory device when any one odd local bit line is selected according to an embodiment of the invention.

FIG. 5 is a diagram for illustrating the operation of the memory device 300 when any one odd local bit line is selected according to an embodiment of the invention. When any one of the odd pass transistors M1, M3, M5, and M7 is selected and enabled, the corresponding odd local bit line is selected and coupled to the global bit line GBL, and the other unselected odd pass transistors and all of the even pass transistors M0, M2, M4, and M6 are disabled. For example, when the odd pass transistor M5 is selected and enabled, the corresponding odd local bit line BL5 is selected and coupled to the global bit line GBL (a current I5 may flow through the odd pass transistor M5), and the other unselected odd pass transistors M1, M3, and M7 and all of the even pass transistors M0, M2, M4, and M6 are disabled. In addition, when any one of the odd pass transistors M1, M3, M5, and M7 is selected and enabled, all of the odd clamp transistors T1, T3, T5, and T7 are disabled by the odd clamp line CLMP<1>, and all of the even clamp transistors T0, T2, T4, and T6 are enabled by the even clamp line CLMP<0> to pull down all of the even local bit lines BL0, BL2, BL4, and BL6 to the ground voltage GND. For example, when the odd pass transistor M5 is selected and enabled, all of the odd clamp transistors T1, T3, T5, and T7 are disabled, and all of the even clamp transistors T0, T2, T4, and T6 are enabled. To be brief, during some operations (e.g., read/program operations) of the memory device 300, one selected odd local bit line is always adjacent to two unselected even local bit lines coupled to the ground voltage GND.

Figure 6:
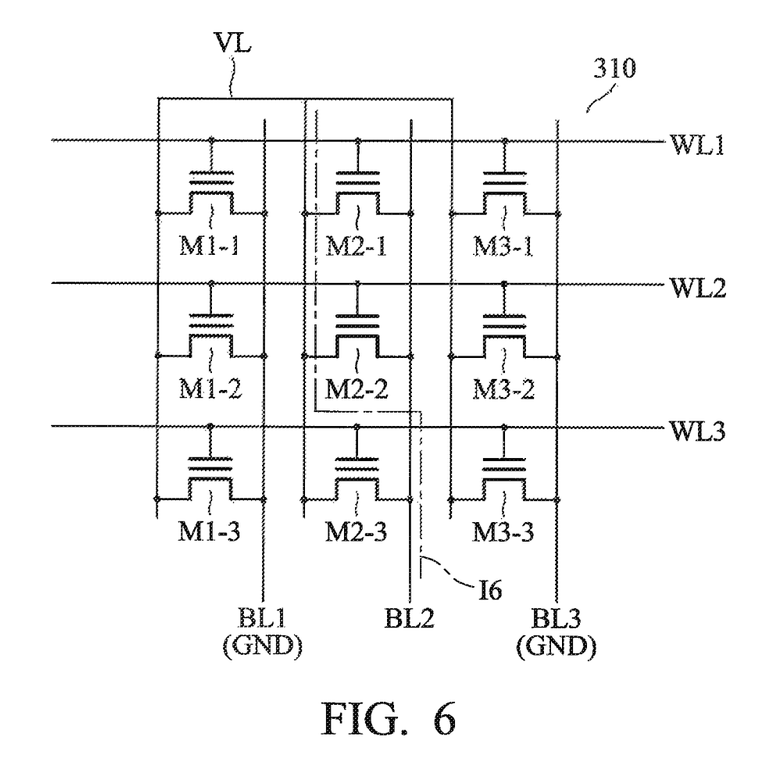
FIG. 6 is a diagram for illustrating a benefit of a memory device according to an embodiment of the invention.

FIG. 6 is a diagram for illustrating the benefit of the memory device 300 according to an embodiment of the invention. As shown in FIG. 6, the memory cell array 310 may comprise a plurality of memory transistors M1-1 to M3-3 (also known as "memory cells"). To simplify the diagram, it is understood that some components of the memory device 300 are omitted and not shown in FIG. 6. Please refer to the embodiment of FIG. 6 in comparison to the conventional design of FIG. 1. When a word line WL2 and a local bit line BL2 are selected, the memory transistors M1-2, M2-2, and M3-2 are enabled, and a current I6 flows through the selected local bit line BL2, the memory transistor M2-2, and a source line VL. Since the even and odd clamp transistors are incorporated into the memory device 300 (not shown in FIG. 6), during the operation of the memory device 300, the adjacent local bit lines BL1 and BL3 are both pulled down to the ground voltage GND, instead of being float, and no unexpected coupling currents are induced and flowing through the memory transistors M1-2 and M3-2 and the unselected local bit lines BL1 and BL3. Accordingly, the capacitive coupling effect on the adjacent memory cells is effectively eliminated in the invention. In comparison to the prior art, the memory device and the column decoder of the invention can provide higher reliability and lower error rates.

Figure 7:
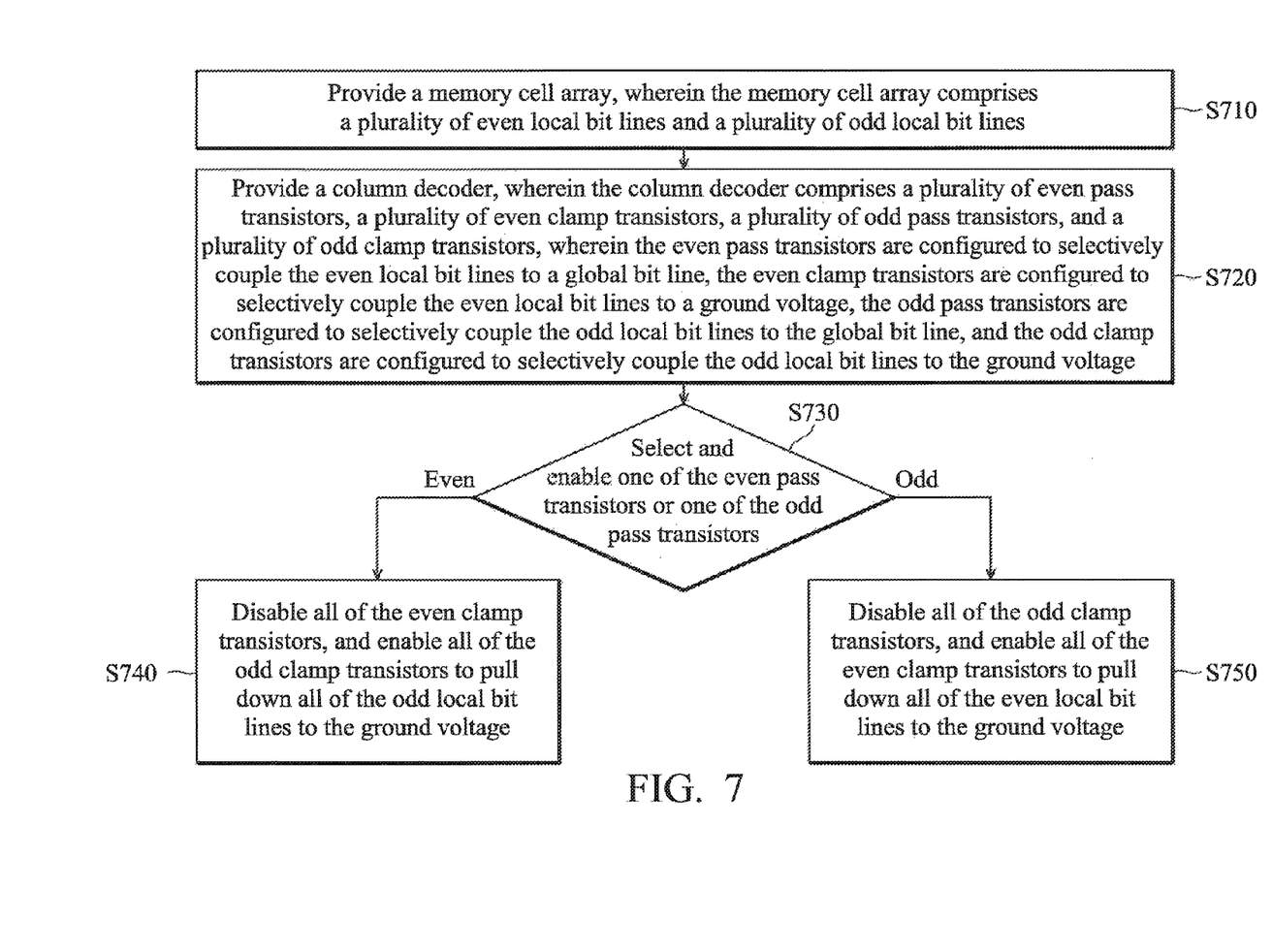
FIG. 7 is a flowchart for illustrating a method for controlling a memory device according to an embodiment of the invention.

FIG. 7 is a flowchart for illustrating a method for controlling a memory device according to an embodiment of the invention. In step S710, a memory cell array is provided, wherein the memory cell array comprises a plurality of even local bit lines and a plurality of odd local bit lines. In step S720, a column decoder is provided, wherein the column decoder comprises a plurality of even pass transistors, a plurality of even clamp transistors, a plurality of odd pass transistors, and a plurality of odd clamp transistors, wherein the even pass transistors are configured to selectively couple the even local bit lines to a global bit line, the even clamp transistors are configured to selectively couple the even local bit lines to a ground voltage, the odd pass transistors are configured to selectively couple the odd local bit lines to the global bit line, and the odd clamp transistors are configured to selectively couple the odd local bit lines to the ground voltage. In step S730, one of the even pass transistors or one of the odd pass transistors is selected and enabled. When one of the even pass transistors is selected and enabled, in step S740, all of the even clamp transistors are disabled, and all of the odd clamp transistors are enabled to pull down all of the odd local bit lines to the ground voltage. In some embodiments, the other unselected even pass transistors and all of the odd pass transistors are further disabled. When one of the odd pass transistors is selected and enabled, in step S750, all of the odd clamp transistors are disabled, and all of the even clamp transistors are enabled to pull down all of the even local bit lines to the ground voltage. In some embodiments, the other unselected odd pass transistors and all of the even pass transistors are further disabled. It is understood that any one or more features of the embodiments of FIGS. 3 to 6 may be applied to the method of FIG. 7.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:
1. A memory device, comprising:
a memory cell array, comprising a plurality of even local bit lines and a plurality of odd local bit lines; and
a column decoder, comprising:
a plurality of even pass transistors, wherein each of the even pass transistors has a control terminal coupled to a respective one of a plurality of even selection lines, a first terminal coupled to a respective one of the even local bit lines, and a second terminal coupled to a global bit line;

a plurality of even clamp transistors, wherein each of the even clamp transistors has a control terminal coupled to an even clamp line, a first terminal coupled to a respective one of the even local bit lines, and a second terminal coupled to a ground voltage;

a plurality of odd pass transistors, wherein each of the odd pass transistors has a control terminal coupled to a respective one of a plurality of odd selection lines, a first terminal coupled to a respective one of the odd local bit lines, and a second terminal coupled to the global bit line; and a plurality of odd clamp transistors, wherein each of the odd clamp transistors has a control terminal coupled to an odd clamp line, a first terminal coupled to a respective one of the odd local bit lines, and a second terminal coupled to the ground voltage.

2. The memory device as claimed in claim 1, wherein when one of the even pass transistors is selected and enabled, all of the even clamp transistors are disabled, and all of the odd clamp transistors are enabled to pull down all of the odd local bit lines to the ground voltage.

3. The memory device as claimed in claim 1, wherein when one of the even pass transistors is selected and enabled, the other unselected even pass transistors and all of the odd pass transistors are disabled.

4. The memory device as claimed in claim 1, wherein when one of the odd pass transistors is selected and enabled, all of the odd clamp transistors are disabled, and all of the even clamp transistors are enabled to pull down all of the even local bit lines to the ground voltage.

5. The memory device as claimed in claim 1, wherein when one of the odd pass transistors is selected and enabled, the other unselected odd pass transistors and all of the even pass transistors are disabled.

6. The memory device as claimed in claim 1, wherein the even local bit lines are respectively interleaved with the odd local bit lines.

7. The memory device as claimed in claim 1, wherein the memory device is NOR flash memory.

8. The memory device as claimed in claim 1, wherein the memory cell array is EEPROM (Electrically-Erasable Programmable Read-Only Memory).

9. The memory device as claimed in claim 1, wherein the even clamp transistors and the odd clamp transistors are NMOS transistors (N-type Metal-Oxide-Semiconductor Field-Effect Transistor).

10. The memory device as claimed in claim 1, wherein the even pass transistors and the odd pass transistors are NMOS transistors (N-type Metal-Oxide-Semiconductor Field-Effect Transistor).

11. A method for controlling a memory device, comprising the steps of:

providing a memory cell array, wherein the memory cell array comprises a plurality of even local bit lines and a plurality of odd local bit lines;

providing a column decoder, wherein the column decoder comprises a plurality of even pass transistors, a plurality of even clamp transistors, a plurality of odd pass transistors, and a plurality of odd clamp transistors, wherein the even pass transistors are configured to selectively couple the even local bit lines to a global bit line, the even clamp transistors are configured to selectively couple the even local bit lines to a ground voltage, the odd pass transistors are configured to selectively couple the odd local bit lines to the global bit line, and the odd clamp transistors are configured to selectively couple the odd local bit lines to the ground voltage;

selecting and enabling one of the even pass transistors or one of the odd pass transistors;

when one of the even pass transistors is selected and enabled, disabling all of the even clamp transistors, and enabling all of the odd clamp transistors to pull down all of the odd local bit lines to the ground voltage; and when one of the odd pass transistors is selected and enabled, disabling all of the odd clamp transistors, and enabling all of the even clamp transistors to pull down all of the even local bit lines to the ground voltage.

12. The method as claimed in claim 11, further comprising:
when one of the even pass transistors is selected and enabled, disabling the other unselected even pass transistors and all of the odd pass transistors.

13. The method as claimed in claim 11, further comprising:
when one of the odd pass transistors is selected and enabled, disabling the other unselected odd pass transistors and all of the even pass transistors.

14. The method as claimed in claim 11, wherein the even local bit lines are respectively interleaved with the odd local bit lines.

15. The method as claimed in claim 11, wherein the memory device is NOR flash memory.

16. The method as claimed in claim 11, wherein the memory cell array is EEPROM (Electrically-Erasable Programmable Read-Only Memory).

17. The method as claimed in claim 11, wherein the even clamp transistors and the odd clamp transistors are NMOS transistors (N-type Metal-Oxide-Semiconductor Field-Effect Transistor).

18. The method as claimed in claim 11, wherein the even pass transistors and the odd pass transistors are NMOS transistors (N-type Metal-Oxide-Semiconductor Field-Effect Transistor).

* * * * *